United States Patent [19]

Harada et al.

[11] Patent Number: 5,296,455
[45] Date of Patent: Mar. 22, 1994

[54] PROCESS FOR PREPARING SUPERCONDUCTOR OF COMPOUND OXIDE OF BI-SR-CA-CU SYSTEM

[75] Inventors: Keizo Harada; Hideo Itozaki; Kenjiro Higaki; Shuji Yazu, all of Hyogo, Japan

[73] Assignee: Sumitomo Electric Industries, Ltd., Osaka, Japan

[21] Appl. No.: 883,228

[22] Filed: May 7, 1992

Related U.S. Application Data

[63] Continuation of Ser. No. 416,639, Oct. 3, 1989, abandoned.

[30] Foreign Application Priority Data

Oct. 3, 1988 [JP] Japan .................. 63-249426

[51] Int. Cl.$^5$ .................. C23C 14/24; C23C 14/34
[52] U.S. Cl. .................. 505/1; 204/192.24; 427/62; 505/731; 505/732; 505/742; 505/782
[58] Field of Search .............. 204/192.24; 505/1, 816, 505/725, 731, 732, 742, 775, 782, 784; 427/62, 593, 604

[56] References Cited

U.S. PATENT DOCUMENTS 4,866,032  9/1989  Fujimori et al. .................. 505/1
5,051,398  9/1991  Higaki et al. .................. 204/192.24

OTHER PUBLICATIONS

Brian Chapman, *Glow Discharge Processes*, John Wiley & Sons, New York, 1980, pp. 237–242.
Brian T. Sullivan et al., Appl. Phys. Lett., 52(23), pp. 1992–1994, Jun. 6, 1988.
A. B. Harper et al., Appl. Phys. Lett., 52(25), pp. 2186–2187, Jun. 20, 1988.
S. A. Shaheen et al., Solid State Communications, vol. 66, No. 9, pp. 947–951, (1988).
M. Hikita et al., "Growth of superconducting single-Crystal Bi-Sr-Ca-Cu-O compounds", *Journal of Crystal Growth*, vol. 91, No. 3, Aug. 1988, pp. 282–286, Amsterdam, NL.
B. W. Statt et al., "Stabilizing the high-Tc superconductor $Bi_2Sr_2Ca_2Cu_3O_{10+x}$ by Pb substitution", PHYSICA C, vol. 156, No. 2, Sep. 1, 1988, pp. 251–255, Amsterdam, NL.
J. H. Kang, et al., "High critical field anisotropy of superconducting Bi-Sr-Ca-Cu oxide from highly oriented thin films" Applied Physics Letters, vol. 52, No. 24, Jun. 13, 1988, pp. 2080–2082, American Institute of Physics, New York, US.
Y. F. Yang et al., "Preparation of superconducting Bi-Ca-Sr-Cu-O thin films of RF magnetron sputtering", IEEE Transactions of Magnetics Applied Superconductivity Conference, Aug. 21, 1988, San Francisco, vol. 25, No. 2, Mar. 1989, pp. 2474–2475, IEEE, New York, US.
J. L. Tallon et al., "High-Tc superconducting phases in the series $Bi_{2.1}(Ca, Sr)_{n+1}Cu_nO_{2n+4+c}$", Nature, vol. 333, No. 6169, May 12, 1988, pp. 153–156, Basingstoke GB.

Primary Examiner—T. Tung
Assistant Examiner—William T. Leader

[57] ABSTRACT

A compound oxide superconductor represented by the general formula:

$$Bi_{4+d}(Sr_{1-x}, Ca_x)_m Cu_n O_{p+y}$$

in which,
"d" is an amount of excess bismuth and satisfies a range of $0 < d \leq 1.2$,
"m" is a number which satisfies a range of $6 \leq m \leq 10$,
"n" is a number which satisfies a range of $4 \leq n \leq 8$,
"p" = $6 + m + n$,
"x" is a number which satisfies a range of $0 < x < 1$, and
"y" is a number which satisfies a range of $-2 \leq < y \leq +2$.

A preferred example is a compound oxide system having the following general formula:

$$Bi_{4+d}Sr_4Ca_4Cu_6O_{20+y}$$

in which "d" is a number which satisfies the range $0.4 \leq d \leq 1.2$ and "y" is a number which satisfies a range of $-2 \leq y \leq +2$. The critical current density ($J_c$) is improved by increasing the amount of bismuth with respect to the stoichiometric amount. A superconducting thin film is deposited on a substrate by physical vapor deposition such as sputtering.

18 Claims, 5 Drawing Sheets

PROCESS FOR PREPARING SUPERCONDUCTOR OF COMPOUND OXIDE OF BI-SR-CA-CU SYSTEM

This is a continuation of application Ser. No. 07/416,639, filed Oct. 3, 1989, now abandoned.

BACKGROUND OF THE INVENTION

1. Field of the invention

The present invention relates to a superconductor of bismuth-containing compound oxide, more particularly, a superconductor of compound oxide of Bi-Sr-Ca-Cu system improved in the critical current density (Jc). The present invention relates also a process for preparing a thin film of such a superconductor.

2. Description of the related art

The critical temperature "Tc" of superconductivity could not exceed 23.2K of $Nb_3Ge$ which was the the highest Tc for the past ten years. The possibility of an existence of new types of superconducting materials having much higher Tc was revealed by Bednorz and Müller who discovered a new oxide type superconductor in 1986 (Z. Phys. B64, 1986 p 189). The new type compound oxide superconductor discovered by Bednorz and Müller is represented by $[La, Sr]_2CuO_4$ which show such higher Tc as 30K which are extremely higher than known superconducting materials. It was also reported that C. W. Chu et al. discovered, in the United States of America, another superconducting material so called YBCO type represented by $YBa_2Cu_3O_{7-x}$ having the critical temperature of about 90K in February 1987 (Physical Review letters, Vol. 58, No. 9, p 908).

It had been known that certain compound oxides containing bismuth exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These superconductors, however, possess rather lower transition temperatures of about 10K and hence usage of liquidized helium (boiling point of 4.2K) as cryogen was indispensable to realize superconductivity.

Maeda et al reported the other type of new bismuth-containing superconducting material of Bi-Sr-Ca-Cu-O system (Japanese Journal of Applied Physics. Vol. 27, No. 2, p 1209 to 1210).

Bismuth type compound oxides are chemically much more stable than the abovementioned YBCO type compound oxide and have such a very important merit that high Tc superconductors of higher than 100K can be realized without using rare earth elements as a constituent element so that the production cost can be reduced.

The above-mentioned new types of superconducting materials were obtained firstly in a bulk form of a sintered block which was obtained by a solid reaction or sintering technique from a powder mixture of oxides and/or carbonates of constituent metal elements which have predetermined atomic ratios.

At the present, it is thought that thin films of these material are much more useful in actual uses. Such thin films can be deposited on a substrate by physical vapour deposition (PVD) technique such as RF sputtering, ion-plating or MBE or chemical vacuum deposition, vapor deposition (CVD) technique such as thermal CVD, plasma CVD, photo-CVD or MOCVD. Usually, the thin films are prepared by RF sputtering technique by using a sintered mass as a target.

It is also a general practice to heat-treat the sintered blocks or thin films in an oxygen-containing atmosphere to adjust the oxygen deficiency in crystals of which sintered blocks or thin films are composed.

The sintered blocks or thin films prepared by the conventional process, however, possessed too low critical current density (Jc) to be used as a material for thin film devices. In fact, the critical current density of the thin film of Bi-Sr-Ca-Cu system obtained heretofore was about 10,000 $A/cm^2$ at most although its critical temperature (Tc) was as high as more than 100K.

The present inventor found in the course of experiments that the superconducting property, particularly the critical current density (Jc) can be improved remarkably if the amount of bismuth is increased excessively with respect to the stoichiometrical amount and the present invention was completed.

Therefore, an object of the present invention is to overcome the problem of the conventional process and to provide a superconductor of bismuth-containing compound oxide, more particularly, Bi-Sr-Ca-Cu system compound oxide improved in the critical current density (Jc).

SUMMARY OF THE INVENTION

The present invention provides a Bi-Sr-Ca-Cu system compound oxide superconductor represented by the general formula:

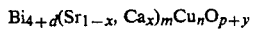

$$Bi_{4+d}(Sr_{1-x}, Ca_x)_mCu_nO_{p+y}$$

in which,

"d" is an amount of excess bismuth and satisfies a range of $0 < d \leq 1.2$, more preferably $0.1 \leq d \leq 1.2$, "m" is a number which satisfies a range of $6 \leq m \leq 10$, more preferably $7 \leq m \leq 9$, "n" is a number which satisfies a range of $4 \leq n \leq 8$, more preferably $5 \leq n \leq 7$, "p" = $6 + m + n$, "x" is a number which satisfies a range of $0 < x < 1$, and "y" is a number which satisfies a range of $-2 \leq y \leq +2$.

The essence of the present invention resides in that the proportion or atomic ratio of bismuth (Bi) in the product is increased much higher than that is thought to be a stoichiometrically optimum value of the Bi-Sr-Ca-Cu system compound oxide.

Namely, this type of superconducting oxide has been represented by the general formula:

$$Bi_4(Sr_{1-x}, Ca_x)_mCu_nO_{p+y}$$

in which, "m", "n", "x", "y" and "p" have the same definition as above.

The present inventor found that the critical current density (Jc) can be improved by increasing the proportion or atomic ratio of bismuth (Bi) ($0 < d \leq 1.2$) with respect to the conventional stoichiometrically optimum value (d=0).

A preferred example of the superconducting compound oxide according to the present invention is a compound oxide system having the following general formula:

$$Bi_{4+d}Sr_4Ca_4Cu_6O_{20+y}$$

in which, $0 < d \leq 1.2$, preferably $0.4 \leq d \leq 1.2$, and $-2 \leq\, <y \leq +2$.

This compound oxide system consists of two stratified layers each having an identical chemical composition but being offset to each other, so that this system can be expressed also by the following general formula:

$$Bi_{2+d/2}Sr_2Ca_2Cu_3O_{10+y/2}$$

in which "d" and "y" have the same definition as above.

Another example of the superconducting compound oxide according to the present invention is a compound oxide having the following general formula:

$$Bi_{4+d}Sr_4Ca_2Cu_4O_{16+y}$$

in which "d" is a number which satisfies the range $0.4 \leq d \leq 1.2$ and "y" is a number which satisfies the range $-2 \leq y \leq +2$.

The superconductor according to the present invention is preferably in a form of thin film deposited on a substrate but can be also a block or a pre-shaped article such as a coil or a ring.

Preparation of the superconductor

The superconductor according to the present invention can be prepared by the conventional techniques.

A bulk-form superconductor according to the present invention can be prepared by sintering a material powder mixture containing constituent elements such as oxides and/or carbonates whose atomic ratios of constituent elements are adjusted in such a manner that the resulting sintered mass has the composition defined by the present invention.

A thin film form superconductor according to the present invention can be prepared by the conventional PVD (physical vapour deposition) such as RF magnetron sputtering, vacuum deposition, ion-plating and MBE or by the conventional CVD (chemical vapour deposition) such as thermal CVD, plasma CVD, photo CVD and MOCVD.

When a RF magnetron sputtering, vacuum deposition or ion-plating method is used as the physical vapour deposition technique, a vapour source or a target can be composed of elemental metals, alloys and/or their compounds such as oxides or carbonates. The vapour source or the target is preferably a sintered mass which is prepared by powder-sintering technique of a material power mixture comprising metal elements and/or their compounds such as oxides, carbonates and fluorides or a sintered powder which is obtained by pulverizing the sintered mass. The vapour source or the target can be also divided into a plurality of segments. In the case of the molecular beam epitaxy (MBE), elemental metals of Bi, Sr, Ca and Cu or their compounds such as their oxides are evaporated by means of a K-cell or an ion beam gun. In this case, oxygen is supplied, if necessary, separately or additionally into an evaporation atmosphere.

In any case, the atomic ratios of metal elements contained in the vapour source or the target are adjusted according to difference in the evaporation rate as well as difference in adsorption of metal elements to the substrate in such a manner that the resulting thin film has the composition defined by the present invention. In practice, the atomic ratio of bismuth in the vapour source or the target is increased by a range defined above comparing to the conventional value.

In a preferred embodiment, the superconductor according to the present invention is prepared in a form of a thin film by RF magnetron sputtering. In the RF magnetron sputtering, the sputtering gas pressure is preferably selected in a range of $1 \times 10^{-2}$ to $1 \times 10^{-1}$ Torr and sputtering gas is preferably a mixture of Ar gas and $O_2$ gas in which the proportion of $O_2$ gas is preferably 10 to 60% by volume.

The substrate on which the thin film of compound oxide is deposited is preferably a single crystal of MgO, $ZrO_2$, $SrTiO_3$, $LiNbO_3$, $LiTaO_3$, $LaAlO_3$, $LaGaO_3$ or the like. It may be used also $LiAlO_3$, $LiCaO_3$, $KTaO_3$, $CaF_2$, $BeF_2$, CSZ, YSZ or even silicon. When a single crystal of silicon is used as the substrate, a buffer layer of MgO or $ZrO_2$ is preferably interposed between the compound oxide layer and the substrate. The superconductor obtained by the process according to the present invention shows crystalline anisotropy in electric resistance, so that the current passing along a direction which is in parallel to a plane defined by a-axis and b-axis of the crystal shows a very high critical current density, while the current passing along c-axis is relatively lower. Therefore, it is preferable to give a desired orientation of crystal to the thin film. For example, when the thin film of the compound oxide is deposited on {001} plane of a single crystal of MgO or $SrTiO_3$, the c-axis of the crystal of the thin film deposited is oriented perpendicular or nearly perpendicular to a surface of the thin film, so that the critical current density (Jc) along the surface is improved. In special applications, it is possible to use {110} plane of the substrate of $SrTiO_3$ in order to orient the c-axis of the crystal of the thin film deposited in parallel to the surface so that higher current density is obtained to the direction of depth. The substrate made of a single crystal of MgO or $SrTiO_3$ are preferable because their thermal expansion coefficient is similar to that of the compound oxide and hence the thin film of the compound oxide doesn't receive serious thermal shock or stress by heat history caused by heating and cooling of the substrate.

The substrate is preferably heated during the sputtering at a temperature between 670° and 750° C., preferably between 670° and 720° C., more preferably between 680° and 710° C. The high-frequency power applied to the target is selected preferably between 0.064 and 1.27 W/cm$^2$ and the deposition rate is selected preferably between 0.05 to 1 Å/min. It is also preferably to heat-treat or anneal the resulting thin film at a temperature between 870° and 910° C.

Particularly, if the substrate temperature during the sputtering is outside the range mentioned above, the critical current density of the resulting thin film drops sharply. The heat-treatment or post-annealing is also very effective to improve the critical current density. This heat-treatment is carried out preferably in oxygen-containing atmosphere or in oxygen stream. Since the annealing temperature is a very important factor, the annealing temperature should be maintained between 870° and 910° C., preferably between 880° and 905° C. for a predetermined time duration, for example between 10 minute and 5 hours. The superconducting properties of the thin film will become worse if the thin film is heat-treated outside the above-mentioned conditions.

The thin film of Bi-Sr-Ca-Cu system prepared under the above-mentioned conditions shows remarkably improved critical current density (Jc) without spoiling the high critical temperature (Tc) which is inherent to this system compound oxide, so that the thin film prepared by the process according to the present invention can be used advantageously to fabricate a variety of superconducting devices including Josephson device which functions above a boiling point of liquid nitrogen. In fact, development of high Tc and high Jc superconductor is demanded in order to realize a Josephson device in which quantum efficiency is observed macroscopically when an electric current is passed through a weak junction arranged between two superconductors. The tunnel junction type Josephson device is also expected to be a high-speed and low-power consuming switching device owing to a smaller energy gap of the superconducting material. High Tc and high Jc superconductors are demanded also in the field of ultra high sensitive sensors for detecting magnetic fields microwaves or radiation. Development of the superconducting devices such as high-speed logic units or of no power-loss wiring materials is also demanded in the field of high-speed computers in which the power consumption per unit area is reaching to the upper limit of the cooling capacity with increment of the integration density in order to reduce energy consumption. The superconductor according to the present invention can be used as a material in these applications.

Figure 1:
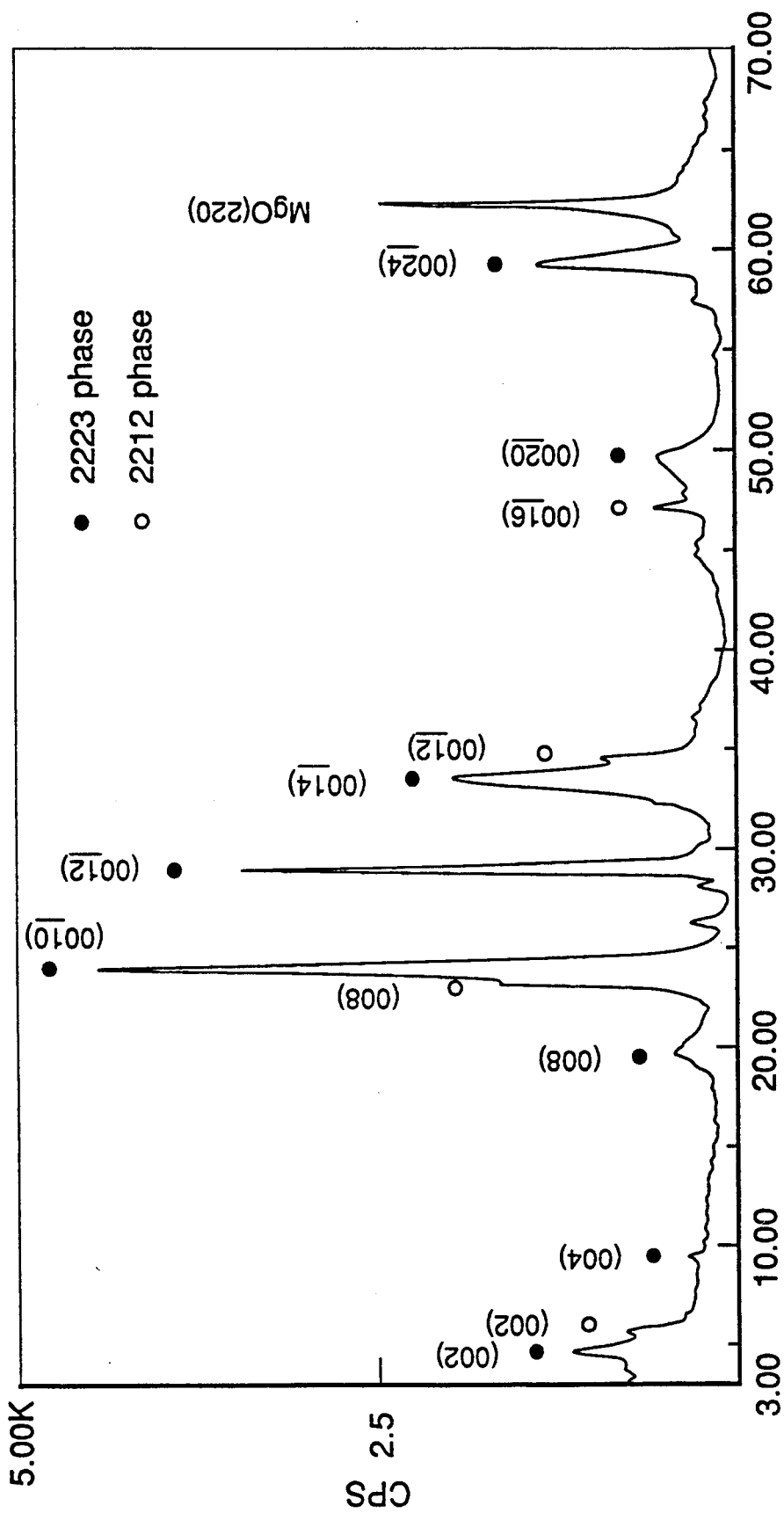
FIGS. 1 to 5 are respective X-ray diffraction charts of thin films of Sample No. 1 to No. 5 prepared in the Example.

Now, the present invention will be described with reference to the Example, but the scope of the invention should not be limited to the Example.

EXAMPLE

Five thin film samples of superconductor of Bi-Sr-Ca-Cu system compound oxide were prepared by the RF magnetron sputtering technique.

In order to prepare each target used in the RF-magnetron sputtering, commercially available powders of $Bi_2O_3$, $SrCO_3$, $CaCO_3$ and $CuO$ were mixed intimately in such proportions that the resulting powder mixtures in each five powder samples had the atomic ratios of elements of Bi:Sr:Ca:Cu as following:

Powder sample 1: Bi:Sr:Ca:Cu = 1.4:1.0:1.0:1.5
Powder sample 2: Bi:Sr:Ca:Cu = 1.5:1.0:1.0:1.5
Powder sample 3: Bi:Sr:Ca:Cu = 1.6:1.0:1.0:1.5
Powder sample 4: Bi:Sr:Ca:Cu = 1.7:1.0:1.0:1.5
Powder sample 5: Bi:Sr:Ca:Cu = 1.8:1.0:1.0:1.5

Then, each powder sample was sintered at 800° C. for 8 hours to obtain sintered mass of Bi-Sr-Ca-Cu compound oxide which was pulverized. The resulting each sintered powder was used, as a powder target, in each sputtering.

As a substrate on which the thin film was deposited, a single crystal of MgO was used and the thin film was deposited on {110} plane of the MgO substrate.

RF magnetron sputtering was effected under the following common conditions:
Substrate temperature: 690° C.
Sputtering gas pressure: $2 \times 10^{-2}$ Torr
Sputtering gas: a mixed gas of Ar and $O_2$ ($O_2/(Ar+O_2)$) = 0.2 (vol)
RF-frequency power: 50 W (0.64 W/cm$^2$)

Each thin film was deposited up to a thickness of 2,000 Å.

The resulting thin films were annealed at 900° C. for 1 hour in oxygen gas of 1 atm.

It was confirmed that all thin films (Sample No. 1 to No. 5) obtained were superconductors by resistance measurement in which the MgO substrates having the thin films were dipped in liquid helium in a cryostat at 8K and the temperature was elevated gradually to determine a critical temperature (Tc) where the film showed normal resistance. The critical temperatures (Tc) determined are summarized in Table 1.

The critical current density was determined at 77.3K by the conventional four probe method and compositions of the thin films were determined by ICP. These results are also summarized in Table 1.

Figure 2:
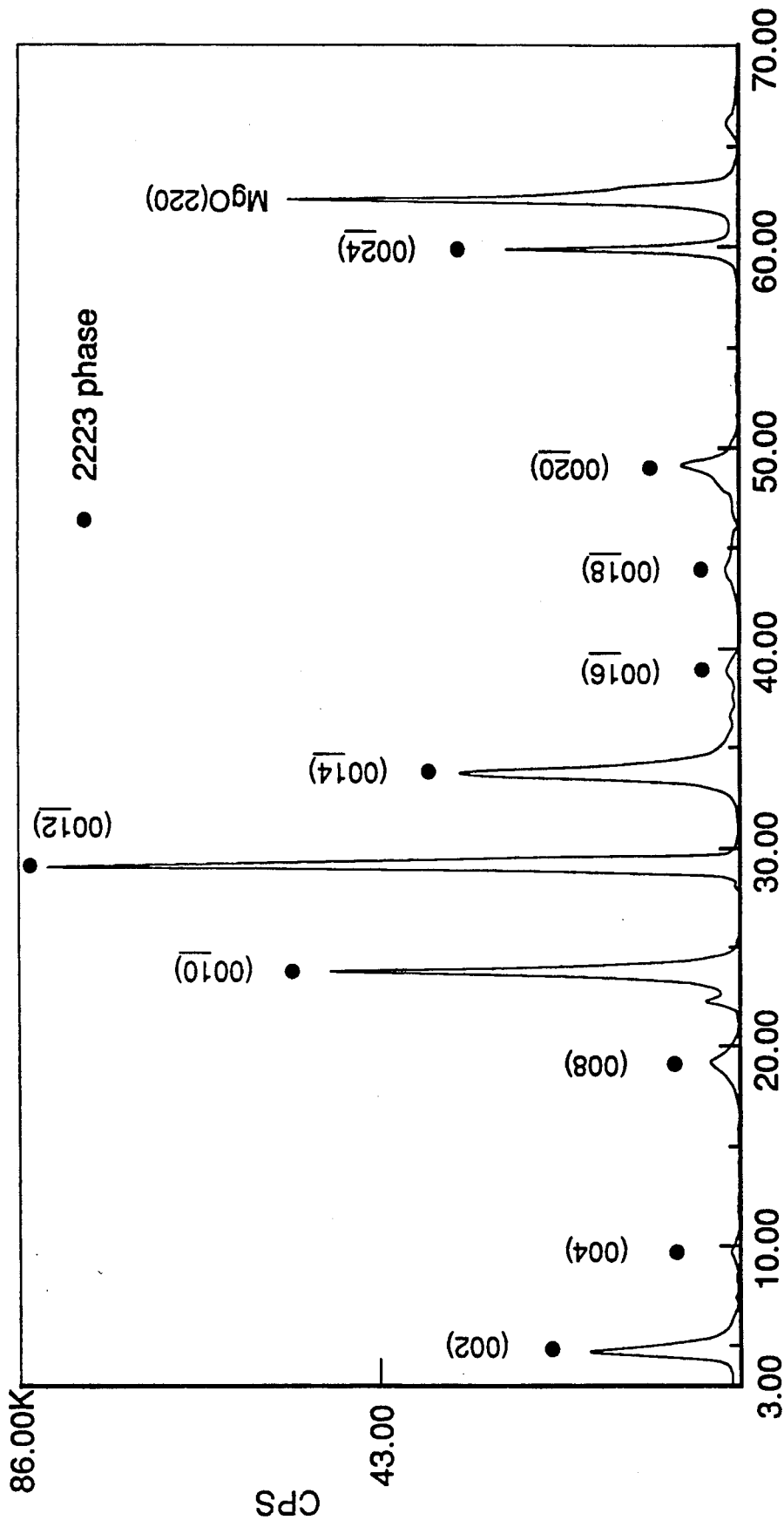
Figure 3:
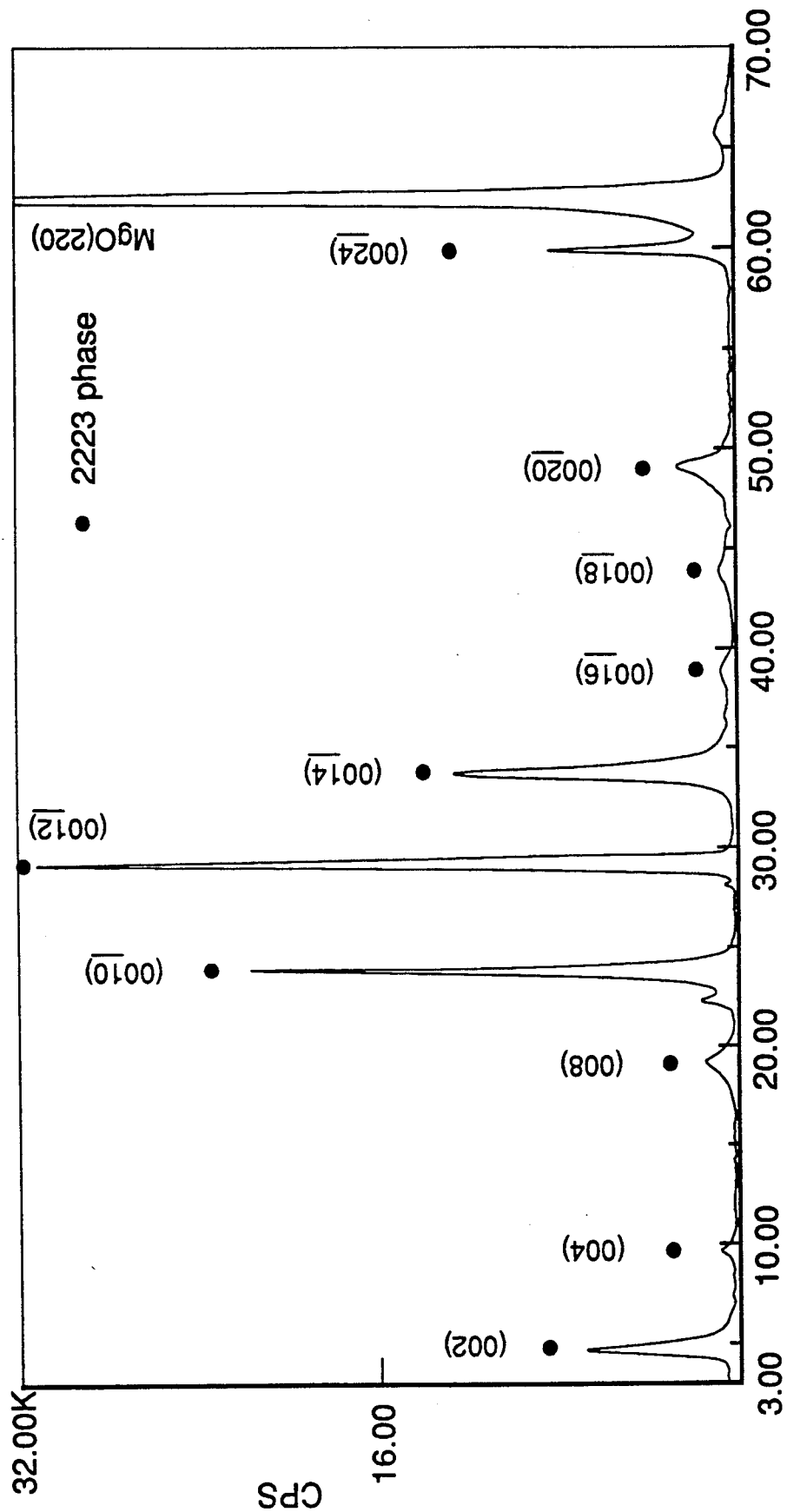
Figure 4:
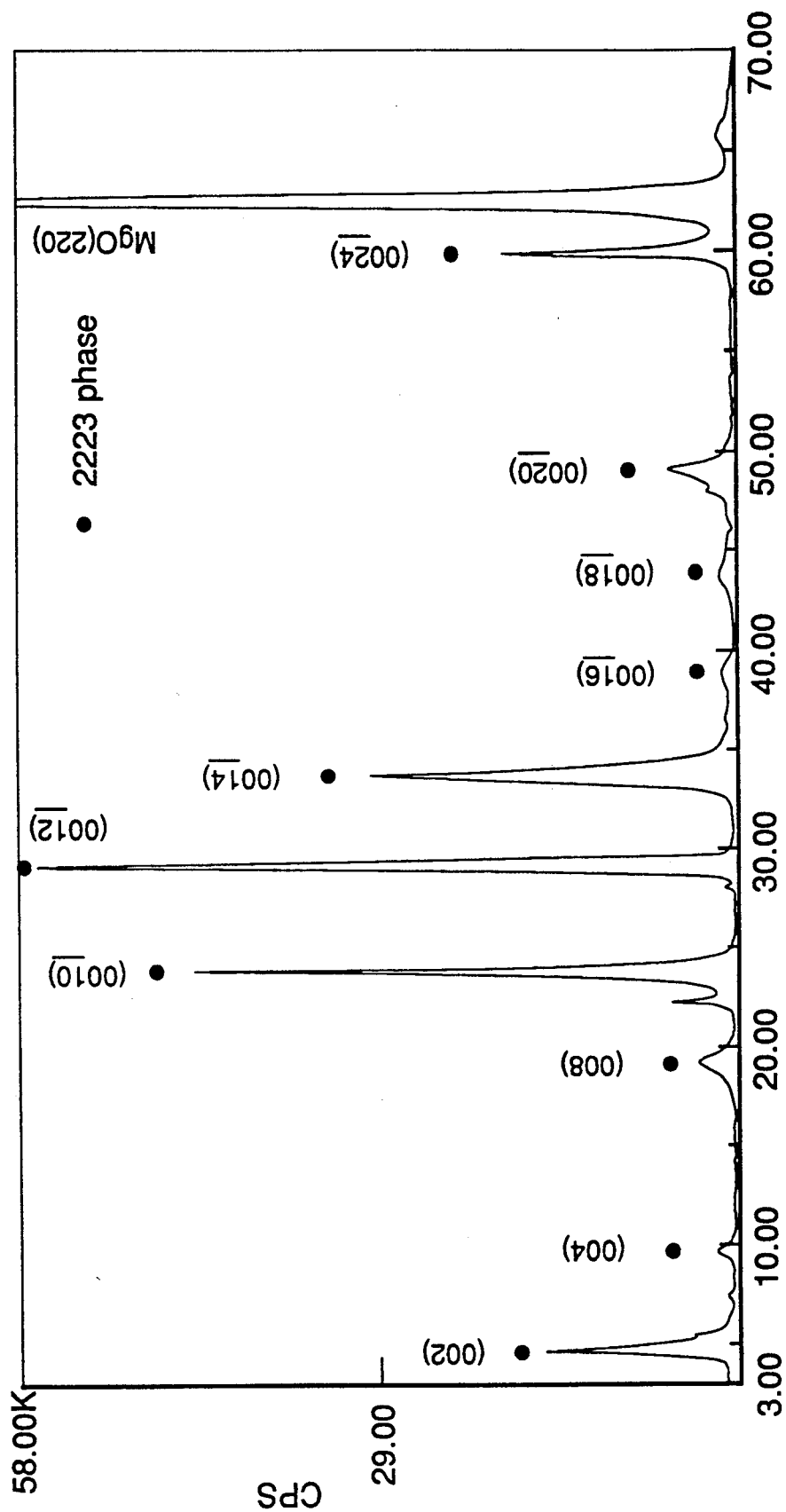
Figure 5:
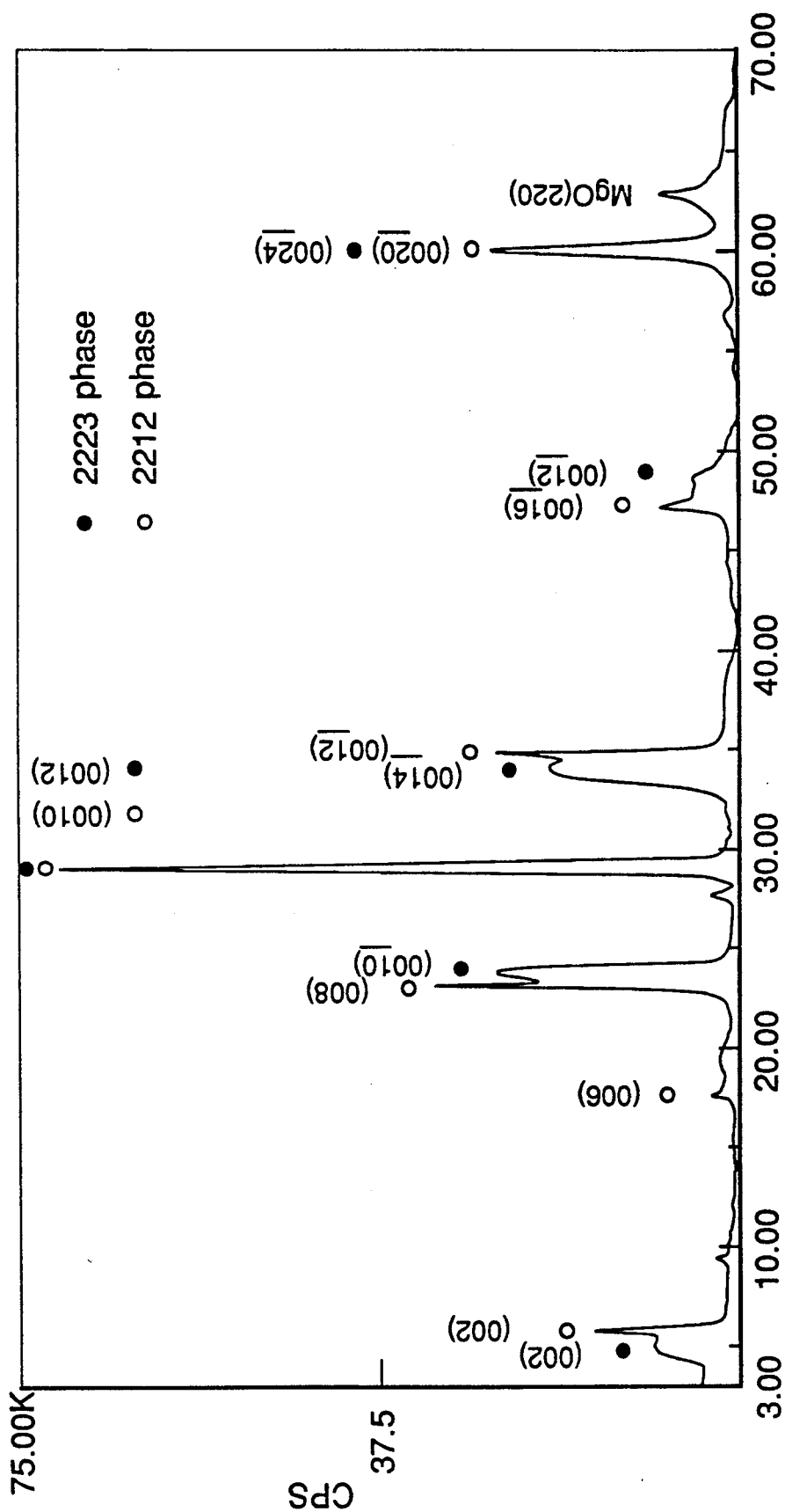

FIG. 1 to FIG. 5 show X-ray diffraction charts obtained from the thin films (Sample No. 1 to No. 5). FIG. 2 to FIG. 4 reveal that the thin films of Sample No. 2 to No. 4 are c-axis oriented films each consists of so-called 2-2-2-3 phase alone. To the contrary, the thin films of Sample No. 1 and No. 5 contain also so-called 2-2-1-2 phase which is a lower superconducting phase.

TABLE 1

| Sample No. | Composition of superconducting thin film | Critical temperature (K) | Critical current density (A/cm$^2$ at 77.3K) |
|---|---|---|---|
| 1 | $Bi_2Sr_2Ca_2Cu_3O_{10-\delta}$ | 92 | $1.2 \times 10^4$ |
| 2 | $Bi_{2.2}Sr_2Ca_2Cu_3O_{10-\delta}$ | 103 | $5.2 \times 10^5$ |
| 3 | $Bi_{2.4}Sr_2Ca_2Cu_3O_{10-\delta}$ | 102 | $1.8 \times 10^6$ |
| 4 | $Bi_{2.6}Sr_2Ca_2Cu_3O_{10-\delta}$ | 100 | $3.7 \times 10^5$ |
| 5 | $Bi_{2.8}Sr_2Ca_2Cu_3O_{10-\delta}$ | 88 | $2.3 \times 10^4$ |

(Sample No. 1 and No. 5 are comparative)

We claim:

1. A process for preparing a superconducting thin film on a substrate, which process comprises depositing a thin film consisting mainly of compound oxide of Bi, Sr, Ca and Cu on a substrate by physical vapor deposition, characterized in that the atomic ratios of Bi, Sr, Ca and Cu in a vapor source or a target used in the physical vapor deposition are a:1:1:1.5, respectively, wherein a > 1 and the deposited thin film has a composition represented by the general formula:

$Bi_{4+d}Sr_4CaCu_6O_{20+y}$ in which,
"d" is a number which satisfies a range of $0.4 \leq d \leq 1.2$, and
"y" is a number which satisfies a range of $-2 \leq y \leq +2$.

2. The process set forth in claim 1 wherein the step of depositing the thin film on the substrate is effected in an oxygen-containing atmosphere.

3. The process set forth in claim 1 wherein the vapour source or target is a sintered mass of a compound oxide of Bi, Sr, Ca and Cu.

4. The process set forth in claim 1 wherein said substrate is a single crystal of MgO.

5. The process set forth in claim 4 wherein the thin film is deposited on {100} plane or {110} plane of a single crystal of MgO.

6. The process set forth in claim 1 wherein the step of depositing the thin film on the substrate is accomplished by sputtering.

7. The process set forth in claim 1 wherein the substrate is heated at a temperature of 670° to 750° C. during the step of depositing the thin film on the substrate.

8. The process set forth in claim 1 further comprising heat treating the thin film deposited on the substrate at a temperature of 870° to 910° C.

9. The process set forth in claim 8 wherein the step of heat treating is effected in an oxygen-containing atmosphere or in an oxygen gas stream.

10. A process for preparing a superconducting thin film on a substrate, which process comprises depositing a thin film consisting mainly of compound oxide of Bi, Sr, Ca and Cu on a substrate by physical vapor deposition, characterized in that the atomic ratios of Bi, Sr, Ca and Cu in a vapor source or a target used in the physical vapor deposition are a:1:0.5:1, respectively, wherein a>1 and the deposited thin film has a composition represented by the general formula:

$$Bi_{4+d}Sr_4Ca_2Cu_4O_{16+y}$$

in which,
"d" is a number which satisfies a range of $0.4 \leq d \leq 1.2$, and
"y" is a number which satisfies a range of $-2 \leq y \leq +2$.

11. The process set forth in claim 10 wherein the step of depositing the thin film on the substrate is effected in an oxygen-containing atmosphere.

12. The process set forth in claim 10 wherein the vapor source or target is a sintered mass of a compound oxide of Bi, Sr, Ca and Cu.

13. The process set forth in claim 10 wherein the substrate is a single crystal of MgO.

14. The process set forth in claim 13 wherein the thin film is deposited on {100} plane or {110} plane of the single crystal of MgO.

15. The process set forth in claim 10 wherein the step of depositing the thin film on the substrate is accomplished by sputtering.

16. The process set forth in claim 10 wherein the substrate is heated at a temperature of 670° to 750° C. during the step of depositing the thin film on the substrate.

17. The process set forth in claim 10 further comprising heat treating the thin film deposited on the substrate at a temperature of 870° to 910° C.

18. The process set forth in claim 17 wherein the step of heat treating is effected in an oxygen-containing atmosphere or in an oxygen gas stream.

* * * * *